United States Patent
Schoenborn et al.

(10) Patent No.: US 7,379,836 B2
(45) Date of Patent: May 27, 2008

(54) METHOD OF USING AUTOMATED TEST EQUIPMENT TO SCREEN FOR LEAKAGE INDUCING DEFECTS AFTER CALIBRATION TO INTRINSIC LEAKAGE

(75) Inventors: Philippe Schoenborn, San Mateo, CA (US); Ramit Bhandari, Fremont, CA (US); Tony Lo, San Jose, CA (US); Anh-Ha Tran, San Jose, CA (US)

(73) Assignee: LSI Corporation, Milpitas, CA (US)

( * ) Notice: Subject to any disclaimer, the term of this patent is extended or adjusted under 35 U.S.C. 154(b) by 0 days.

(21) Appl. No.: 11/300,789

(22) Filed: Dec. 14, 2005

(65) Prior Publication Data

US 2007/0136023 A1    Jun. 14, 2007

(51) Int. Cl.
*G01R 31/02* (2006.01)
*G01R 31/26* (2006.01)

(52) U.S. Cl. .................... 702/117; 324/765
(58) Field of Classification Search ............ 702/57, 702/58, 117, 118, 120, 121, 123, 179, 183; 324/765; 714/738, 741
See application file for complete search history.

(56) References Cited

U.S. PATENT DOCUMENTS 6,140,832 A * 10/2000 Vu et al. ............... 324/765
6,459,293 B1 * 10/2002 Keshavarzi et al. ...... 324/765

* cited by examiner

*Primary Examiner*—John Barlow
*Assistant Examiner*—John Le
(74) *Attorney, Agent, or Firm*—Beyer Law Group LLP

(57) ABSTRACT

The present invention is directed to a method of identifying test devices having excessive leakage current and also includes computer program products that enable the same. The method obtaining background test data using a test routine to measure the leakage current for a set of test devices as a function of a parameter associated with device speed for the device under test. From the test data, a leakage threshold function is defined that correlates leakage current with the parameter associated with device speed. The test routine and the leakage threshold function are then input into an automated testing apparatus configured to execute the test on production or other devices. Devices are tested to determine leakage current over a range of parameter values associated with device speed. The devices are then screened using the leakage threshold function to determine the status of the device.

13 Claims, 7 Drawing Sheets

METHOD OF USING AUTOMATED TEST EQUIPMENT TO SCREEN FOR LEAKAGE INDUCING DEFECTS AFTER CALIBRATION TO INTRINSIC LEAKAGE

FIELD OF THE INVENTION

The invention described herein relates generally to methods and processes used for detecting the presence of leakage inducing defects in semiconductor dies. In particular, the present invention relates to methods and processes used by automated testing equipment (ATE) to measure the relationship between leakage current and a proxy for device speed in order to identify such defects while the test subjects are still on the ATE's.

BACKGROUND OF THE INVENTION

One important measure of semiconductor electronic device performance is leakage current. Excessive leakage currents can be indicative of serious defects in the device. Many methods are employed to measure such leakage currents. One particularly relevant complication is the role that device speed (Kp) plays in determining whether a leakage current is too high or not. Many methods of measuring these two values are known and employed in device screening. All have significant limitations and shortcomings. Some of these existing methodologies are described as follows.

An IC (integrated circuit) device has a nominal amount of leakage from the power supply to the ground caused by the cumulative leakage of all associated transistors (source to drain leakage, substrate leakage, gate leakage, etc.). Under normal conditions all IC's have some leakage. This is defined as a baseline leakage current. As is known to those having ordinary skill, typical measures of such leakage include so-called Static $I_{dd}$ (SIDD) or quiescent leakage ($I_{ddq}$). These can be measured when the device transistors are put in a known off-state with the proper conditioning pattern and test vector stop locations.

However, when certain defects are present in a device these leakage currents can become substantially elevated. For example, when a physical silicon defect exists in a transistor or along a wire line, the leakage current may be substantially increased above its normal baseline level. Typically, this can be caused by either a direct path from the power supply to ground or from the inability to turn off all transistors as intended by the test pattern used to measure leakage current. By detecting the elevated leakage current, test routines can be used to identify devices that have certain defects and thereby screen out defective parts that may not be functional in the field or pose a reliability issues over the lifetime of the device.

In the prior art a number of methods have been tried to effectively measure this leakage current and screen devices using these measurements. In one approach, all devices having a leakage current in excess of a fixed leakage limit are deemed defective and discarded. In this approach the speed of the devices is not considered. In another approach, in order to test devices, each device is constructed with a specially constructed test cell formed in the device. The test cell is configured to measure device speed which is then related to an intrinsic leakage value associated with that device's speed. One such cell type is the PROCMON cell used by LSI Logic Corporation to measure device speed (Kp). This value is associated with measured values of leakage current. Using the leakage and device speed data obtained from each cell (each device) a picture of device performance can be formed and used to eliminate devices having excessive leakage currents. In yet another embodiment of the prior art, the acceptable level of intrinsic leakage is statistically determined from a defined sample (e.g. one wafer lot, or one wafer) and outliers are thus eliminated in post-processing (SPP) evaluation of the sample.

Each of the previously discussed methodologies suffers from its own unique set of limitations. For example, when a fixed leakage current limit is employed, leakage current is used to screen all devices without regard for device speed (Kp). In such cases ineffective screening can occur. With advanced CMOS technologies and deep-submicron gates the intrinsic and therefore acceptable leakage level depends strongly on the exact dimension of the gates (CD) and other factors. Consequently, a fixed $I_{dd}$ limit is no longer suitable for screening leakage-inducing defects. Typically, a leakage limit set too low screens out too many otherwise functional devices. Setting the limit too low results in a failure to screen out defective devices. Accordingly, this prior art method results in either excessive and unjustified fallout or ineffective screening of true defects.

When a dedicated performance-measuring cell is used, the test cell is used to directly measure the speed of the device (Kp). Such cell usage generates its own unique set of problems and shortcomings. First, the method cannot be employed to test devices that do not have the cell. This is particularly problematic when other manufacturers devices (which may not have a test cell or use a different test cell for which the user cannot test) are employed as they cannot easily be harmonized into existing test regimes. Additionally, the used of such test cells takes up valuable real estate on the surface of the device. This results in less function in the device or the exclusion of other desired functions. Additionally, because the test cell necessarily takes up only a small portion of a device surface it is not necessarily sensitive to variations in transistor speed occurring elsewhere on the device. If the speed-measurement test cell happens to reflect a faster area of the device it will result in an overestimation of the acceptable amount of intrinsic leakage and hence a reduced ability to screen defects that cause higher leakage. On the other hand if the test cell is in a slower area of the device it will result in an underestimation of the acceptable intrinsic leakage and therefore may cause over-rejection of otherwise acceptable devices. Thus, many defects can be missed using such test cells.

Additionally, the most common method used for such detection, Statistical Post Processing (SPP) has a variety of deficiencies that are difficult to remedy. SPP consists of the taking of many measurements of leakage current as well as directly measuring the operating speeds (Kp) of the devices. This accumulated data is subject to processing after collection by the automated test equipment (ATE). Typically, such involved statistical processing is done "off-line". The resulting statistical information allows for leakage-inducing defect screening based on the off-line analysis of statistical outliers from a given sample populations, e.g. wafer lot, dies across a wafer, device lots, and the like. This method requires automated data collection and downloading from the ATE to a server and the software to filter out "outliers" after wafer sort with the ability to "ink-out" defective dies from the wafer sort database. In most cases SPP is not suitable for packaged devices where the trace to the wafer source location of the die can be lost. Additionally, such analysis takes time. For example, adequate testing of a single wafer can take as long as an hour. Thus, the software execution time forces a great deal of temporal overhead into the process. This removes the ability to conduct any sort of "real-time" testing. Additionally, to be valuable, thousands of pieces of data are required to generate accurate data that can be used from lot to lot. Thus, many lots of dies or devices must be tested before even the first evaluations can be made. Furthermore such screening can only take place on wafer-sort data where a device's speed and leakage can be associated to a wafer or lot and compared to its peer distribution and it cannot be easily conducted in real-time on an isolated assembled device during final test Thus, such testing is of limited value at the ATE evaluation stage because the data is not obtained until much after the wafers have been taken off of the ATE's and are further on in the process. In short, this process is too slow to be effective.

The inventors have recognized that there is a need for improving existing testing methods. What is needed is a methodology for enabling faster and more complete testing to be performed that measures both leakage current and a parameter associated with device speed to enable quick and accurate screening to identify devices with excessive leakage currents. Moreover, there is a need for such methodology to take into consideration normal and expected global shifts in intrinsic leakage levels and compensate for them.

SUMMARY OF THE INVENTION

The principles of the present invention disclose a method for identifying defective devices having an excessive leakage current. In particular, the invention includes embodiments capable of executing such tests in "real-time" on the automated test equipment used to conduct the testing rather than having to conduct post processing analysis of the testing.

In one particular embodiment, the method of the invention describes a method for identifying test devices having excessive leakage current. The method embodiment involves obtaining background test data by using a test routine to measure the leakage current for a set of test devices as a function of a parameter associated with device speed for the device under test. In some embodiments, the parameter is test operating frequency. The method further involves determining, from the test data, a leakage threshold function that correlates with the parameter associated with device speed. The leakage threshold function defining a leakage current value above which the device under test is determined to have failed the test. The test routine and the leakage threshold function are then input into an automated testing apparatus configured to execute the test on production or other devices. Devices are tested to determine leakage current over a range of parameter values associated with device speed. The devices are then screened using the leakage threshold function to determine the status of the device.

In another embodiment, the invention describes a computer program product having computer program code for identifying defective devices having excessive leakage current. The computer program product including computer program code instructions for executing a test routine capable for measuring leakage current of a device under test as a function of a parameter associated with device speed for the device. Further instructions compare a measured leakage current value with a leakage current threshold function that has been previously determined by operating the test routine on a set of test devices, wherein the leakage current threshold function correlates leakage current with a parameter associated with device speed. Also, the program includes instructions for screening devices that have measured leakage currents in excess of a value defined by the leakage current threshold function.

In another embodiment, the invention describes a computer program product having computer program code identifying defective devices having excessive leakage current. The product including computer program code instructions for executing a test routine on a set of test devices to generate test data. Wherein the test routine measures the leakage current for test devices at a plurality of test operating frequencies. The product includes further instructions for processing the test data to define a leakage current threshold function that characterizes leakage current as a function of a test operating frequency and defines an acceptable leakage current over a range of test operating frequencies. Further instructions concern executing the test routine on an automated testing apparatus to test integrated circuit devices and screening the tested IC's using the current threshold function.

These and other features and advantages of the present invention are described below with reference to the drawings.

BRIEF DESCRIPTION OF THE DRAWINGS

The following detailed description will be more readily understood in conjunction with the accompanying drawings, in which.

It is to be understood that, in the drawings, like reference numerals designate like structural elements.

DETAILED DESCRIPTION

The present invention has been particularly shown and described with respect to certain embodiments and specific features thereof. The embodiments set forth hereinbelow are to be taken as illustrative rather than limiting. It should be readily apparent to those of ordinary skill in the art that various changes and modifications in form and detail may be made without departing from the spirit and scope of the invention.

Figure 1:
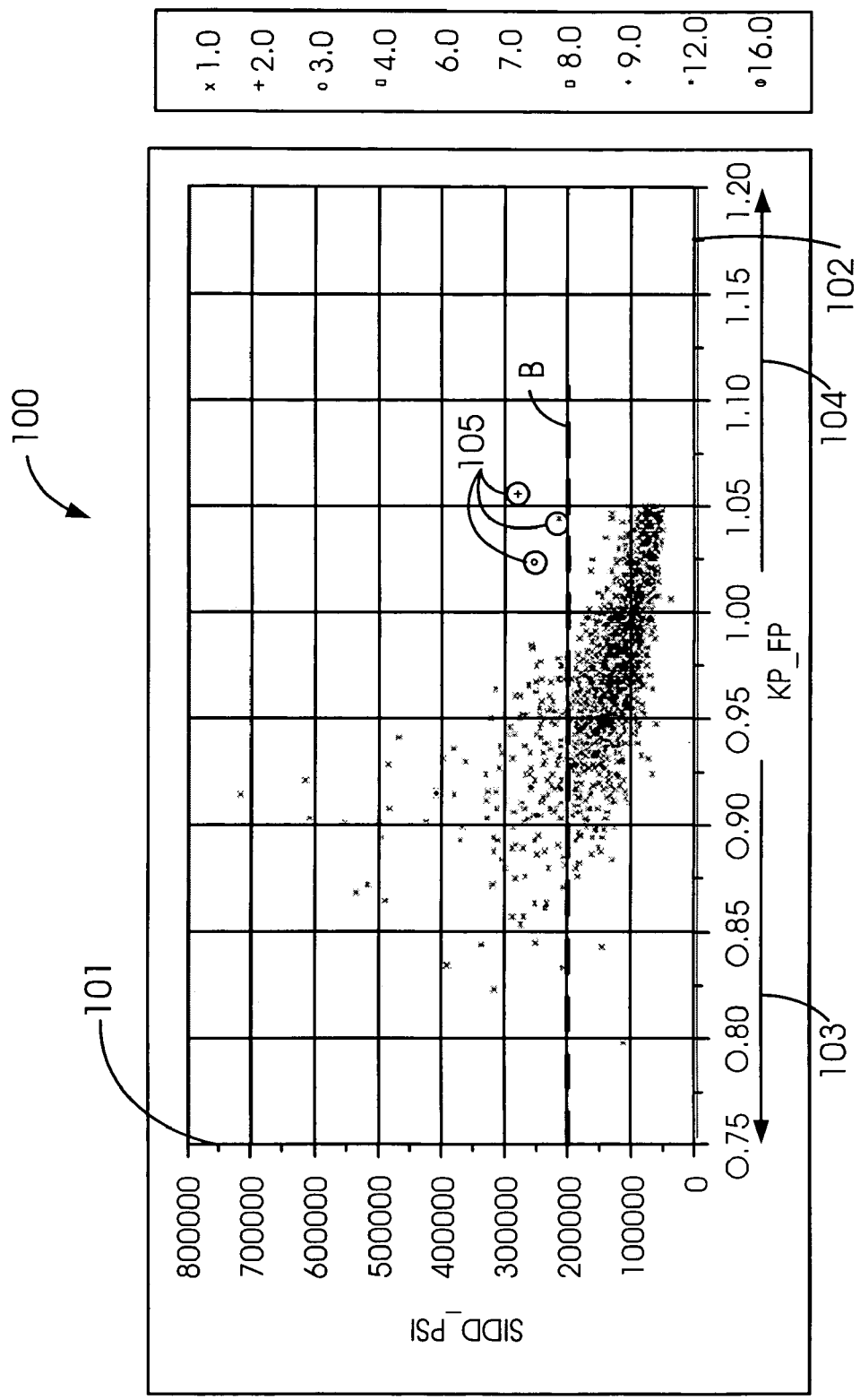
FIG. 1 is a graphical illustration of a relationship between leakage current and device speed.

FIG. 1 defines some observed characteristics regarding semiconductor integrated circuit test results. By using a dedicated diagnostic cell fabricated as part of an integrated circuit device certain performance characteristics can be observed. FIG. 1 is a graphical depiction 100 that maps leakage current as a function of devices speed. Typical measures of such leakage are referred to as Static $I_{dd}$ (SIDD) and quiescent leakage current ($I_{ddq}$). Many other measures of such leakage current are known to those of ordinary skill and the inventors contemplate that all such measures can be used in accordance with the principles of the invention.

In any case, in FIG. 1, one axis 101 demarcates leakages current (measured here, for example, as SIDD). The other axis 102 defines a measure of device speed. In the depicted image the device speed is indicated by Kp (a standard measure of device speed). A Kp of 1.0 describes a device that is performing at a predicted speed for that device. Generally, this means that a model is used that defines the theoretical expected performance of the device, when a device performs at that speed it has a Kp of 1. As one moves to the left 103 toward lower Kp values, this indicates a faster device. Expectedly, as one moves to the right 104 toward higher Kp values, this indicates a slower device.

The graph 100 shows a typical characteristic speed v. leakage current distribution. For one, it is noted that as the devices become faster the leakage currents also characteristically increase. Thus, a best-fit curve fitted to the data would generally slope upward to the left. Additionally, it is also noted that as the devices become faster the distribution of leakage currents widens. This sets the stage for one of the basic problems of screening such devices. A static leakage current threshold set at any arbitrary value is going to exclude functional devices or fail to detect some amount of defective devices. This is illustrated by the threshold line B.

For slower die, threshold line B provides an excellent screen of defective die. In the slower die region many outliers (for example, outliers 105) are easily discerned and screened out as defective. As the faster die are screened it is clear that many operable die will be screened out by the indicated threshold. This is unacceptable. Added to this problem is the fact that all this information must be obtained off-line in Statistical Post Processing (SPP). Typically, for ordinarily for common lot sizes such analysis takes in excess of an hour to complete. Thus, this information cannot be supplied to QA people in anything close to real-time. This is problematic because the tested die are by this time far down the processing stream. It would be advantageous to be able to conduct such screen in "real-time" very quickly while the devices are still on the ATE that conducts the testing.

The present invention offers solutions to this problem. In one embodiment, the invention describes a method for identifying leakage defects.

The problem with such real time analysis of devices is that current art methods of testing devices cannot easily and quickly measure Kp and leakage current. Hence, the prior art need for SPP. However, the inventors have discovered that by varying the test speed an analog to device speed can be created. So during the testing of devices to determine leakage current the test operating frequency is varied. Typically, such testing involves inputting a test sequence of data and then reading the data out and comparing data in with data out. As long as the results agree the device passes the test. As the test operating frequency rises the devices begin to fail the test (i.e., give erroneous results). All devices have a failure speed at which they no longer can function properly. Typically, this testing is performed using chosen test blocks such as functional blocks or TDF (Timing Delay Fault) blocks. The testing frequency at which the devices fail is referred to as the maximum test operating frequency or simply $F_{max}$.

Figure 2:
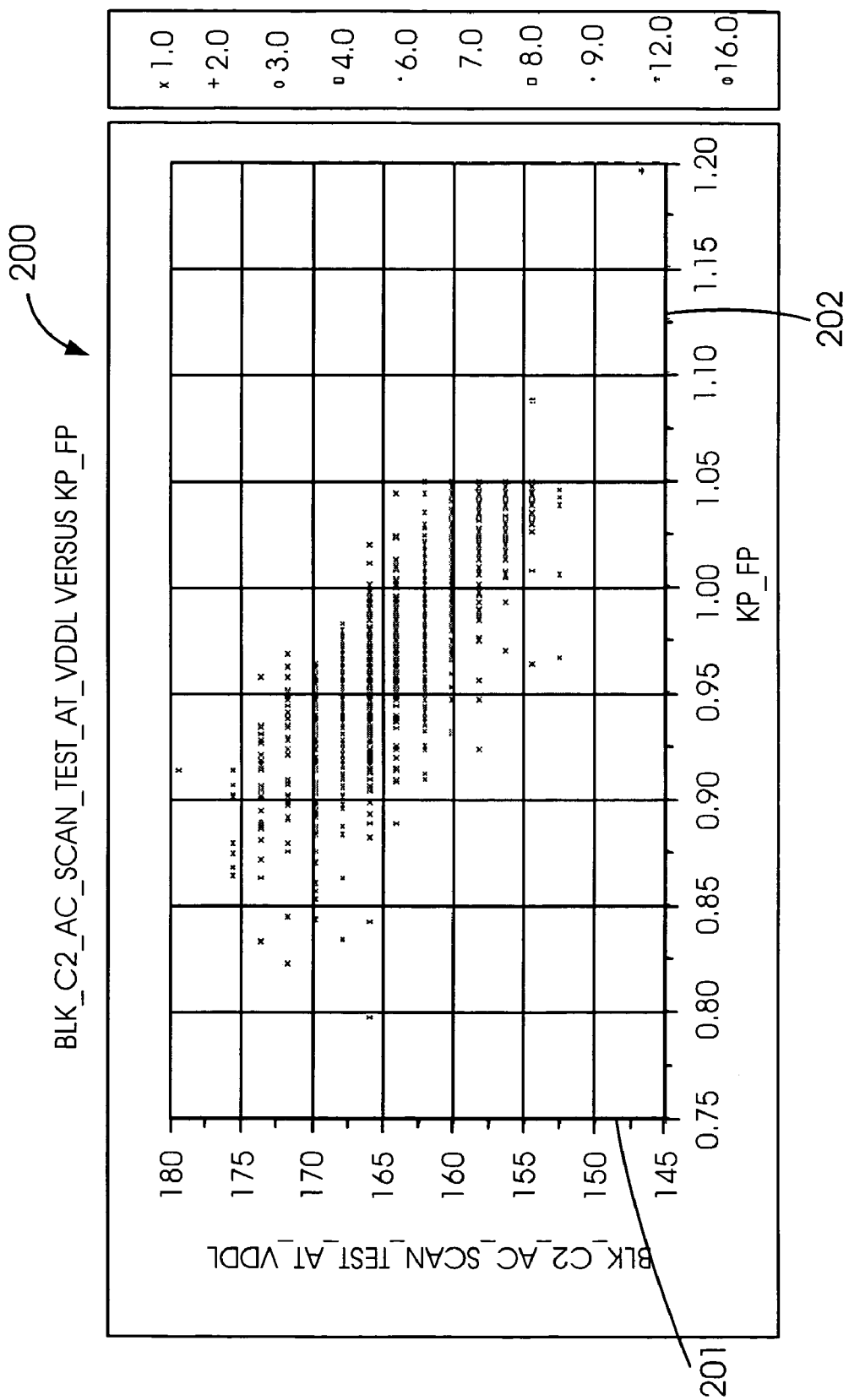
FIG. 2 is a graphical illustration of a relationship between test operating frequency and device speed.

The inventors have identified that there is a strong relationship between $F_{max}$ (maximum test operating speed) and Fp (maximum device speed). FIG. 2 clearly indicates an example of this relationship. The graph 200 of FIG. 2 shows one axis 202 that defines device speed (as indicated by Kp). As in FIG. 1, a Kp of 1.0 describes a device that is performing at a predicted speed for that device. Also, moving to the left toward lower Kp values indicates a faster device as moving to the right indicates a slower device. The other axis 201 is defined by the $F_{max}$ of the device. The graph 200 easily shows that faster devices having lower Kp values have higher $F_{max}$. Advantageously, $F_{max}$ can be determined very quickly and efficiently. This determination taking no more than a few seconds for each device. Thus, the parameter of $F_{max}$ is an excellent proxy measurement for device speed. Other parameters can also be employed. In general when test operating frequency is used, any range of testing frequencies can be employed, as long as they are supporter by the particular test apparatus employed. However, a typical range of frequencies can be from about 50 MHz (megahertz) to 500 MHz. Typically, 15-40 tests are run on each device.

This relationship can be used to characterize devices and use then to screen out devices having excessive leakage currents. In one implementation, a test set of devices is prepared having a range of device speeds. Such devices are typically constructed as family of "skew lots" of the same devices. For example, devices can be constructed having varying gate lengths (short gates being faster, longer gates being slower) or other parameters that effect device speed can be altered. The methods of constructing such test sets of skew lots are well known to those of ordinary skill in the art. Such test set can be constructed well in advance of actual testing of the devices. The devices can then be tested and measurements of leakage current and Fmax can then be made. This database can then be evaluated. Such evaluation can be done off line prior to any testing of "production" devices.

Figure 3:
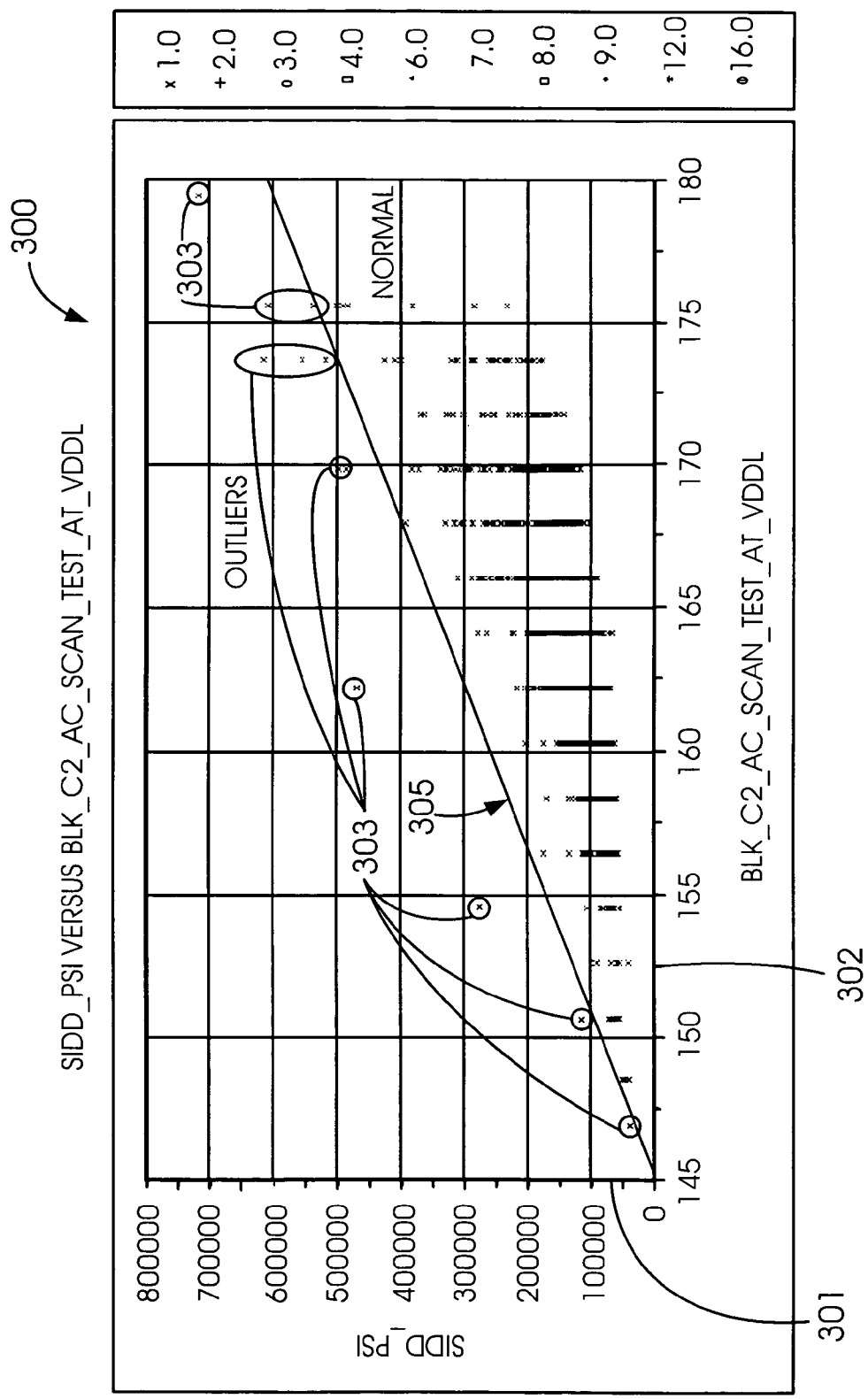
FIG. 3 is a graphical illustration of a relationship between leakage current and test operating frequency showing one example of a leakage current threshold function of the present invention.

FIG. 3 is a graphic depiction of a plot 300 of test data collected mapping each tested device as a data point. The legend of axis 301 is defined by the leakage current produced at $F_{max}$ for the device. Axis 302 defines $F_{max}$ (maximum test operating frequency) for the device. A line 305 has been drawn on the graph 300. The line is one example of a leakage current threshold curve 305 that defines the leakage current limit for "satisfactory" devices. The outliers (devices having an extraordinarily high leakage current) ear easily identified and lie above the example threshold curve 305. It is important to point out that the same devices generated the data of FIGS. 1-3. Thus, a defect detection tool has now been disclosed that enables leakage defects to be detected in devices having a wide range of device speeds. The method is sensitive to device speed and is fast being capable of defect detection while the devices are still on the ATE's doing the testing.

Embodiments of the invention combine the advantages of IDD (leakage current) screening with a sliding threshold level based on the device speed which relates to the intrinsic leakage and the simplicity of an implementation entirely confined to within the ATE environment.

First the baseline IDD level (intrinsic leakage) is related to the speed of the device by measuring the maximum frequency ($F_{max}$) of chosen test blocks such as functional blocks or TDF (Transition Delay Fault) blocks. "Off-line" characterization is used to characterize parts with various speeds (e.g. gate CD skew lot) with the allowable intrinsic leakage levels for each Iddq vector. This characterization can be determined and programmed into the ATE test program with a formula for filtering outliers during production.

By characterizing a dataset (such as shown in FIG. 3) the appropriate intrinsic leakage level vs. $F_{max}$ relationship can be determined and a screening formula can be established against which each wafer-level die or packaged device will be tested and qualified. When the leakage measurement exceeds the preset limit corresponding to that device Fmax the part is rejected.

Figure 4:
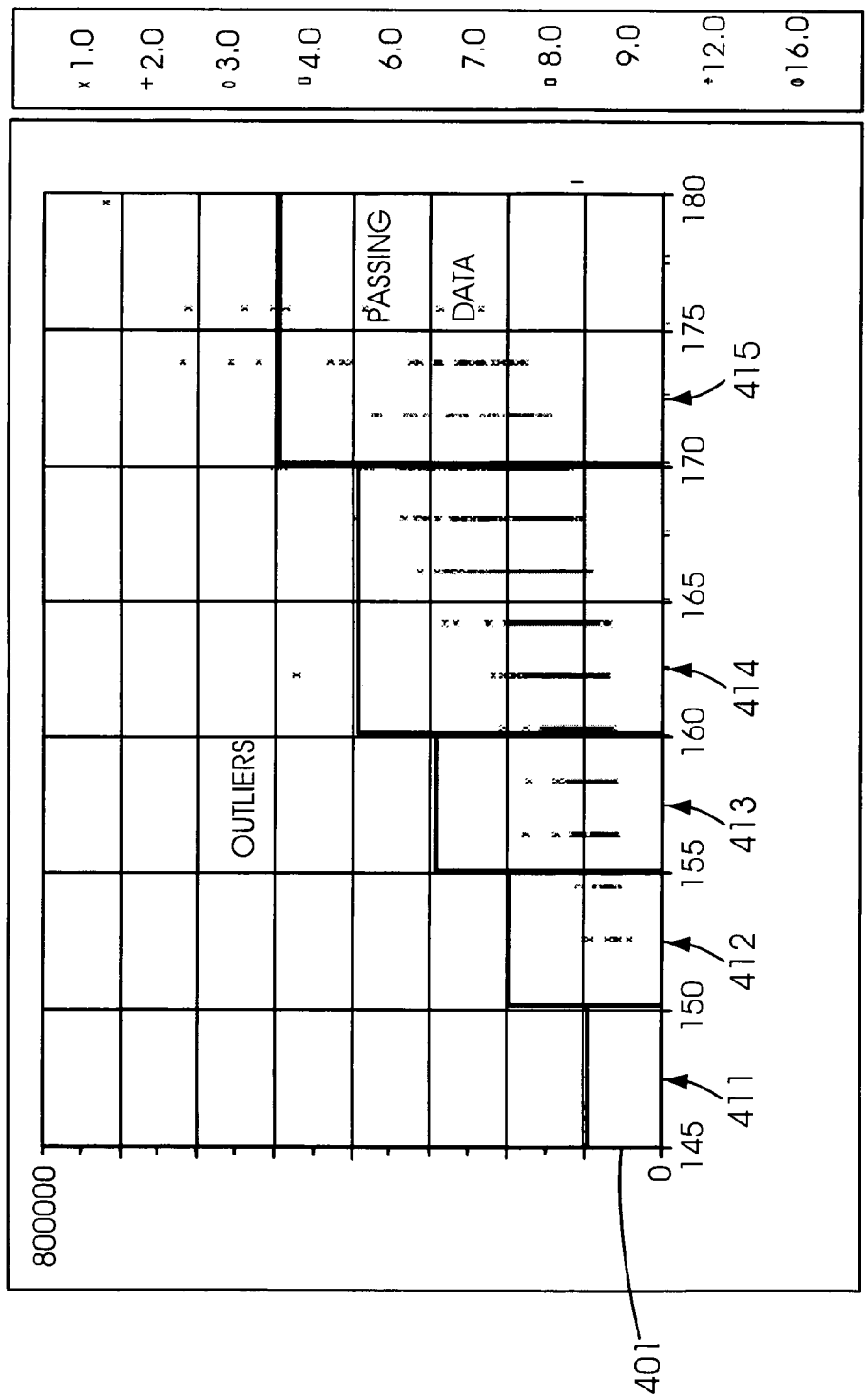
FIG. 4 is a graphical illustration of a relationship between leakage current and test operating frequency showing another embodiment of a leakage current threshold function of the present invention.

Once the test data set is obtained a leakage current threshold function can be defined in accordance with the needs of the user. For example a strictly linear threshold function such as shown in FIG. 3 can be employed. However, many alternative implementations are also contemplated. For example, reference is made to FIG. 4. As shown in FIG. 4 a "step function" can be used to characterize the leakage threshold.

FIG. 4 is a graphic depiction of a plot 400 of test data collected mapping each tested device as a data point. A first axis 401 is used to characterize leakage current produced at $F_{max}$ for the tested device. Axis 402 defines $F_{max}$ (maximum test operating frequency) for the device. The $F_{max}$ range can be divided into several bins (411-415) of selected sizes. These "bins" define a series of test operating frequency regimes that can be defined to cover any specified range of test operating frequencies. A threshold limit for leakage current can be set for each bin (for example threshold value "×" for bin 411). Devices having leakage currents in excess of the defined limit are characterized a defects and can be processed accordingly. This approach works well when leakage current varies slowly with respect to $F_{max}$. Alternatively, this approach works well when the leakage current has a non-continuous relationship to $F_{max}$ (e.g., it behaves as a step function). Additionally, rather than a horizontal linear threshold, the threshold for each bin can be defined by an angular line or a curved threshold value designed to alter the selectivity of devices.

Figure 5:
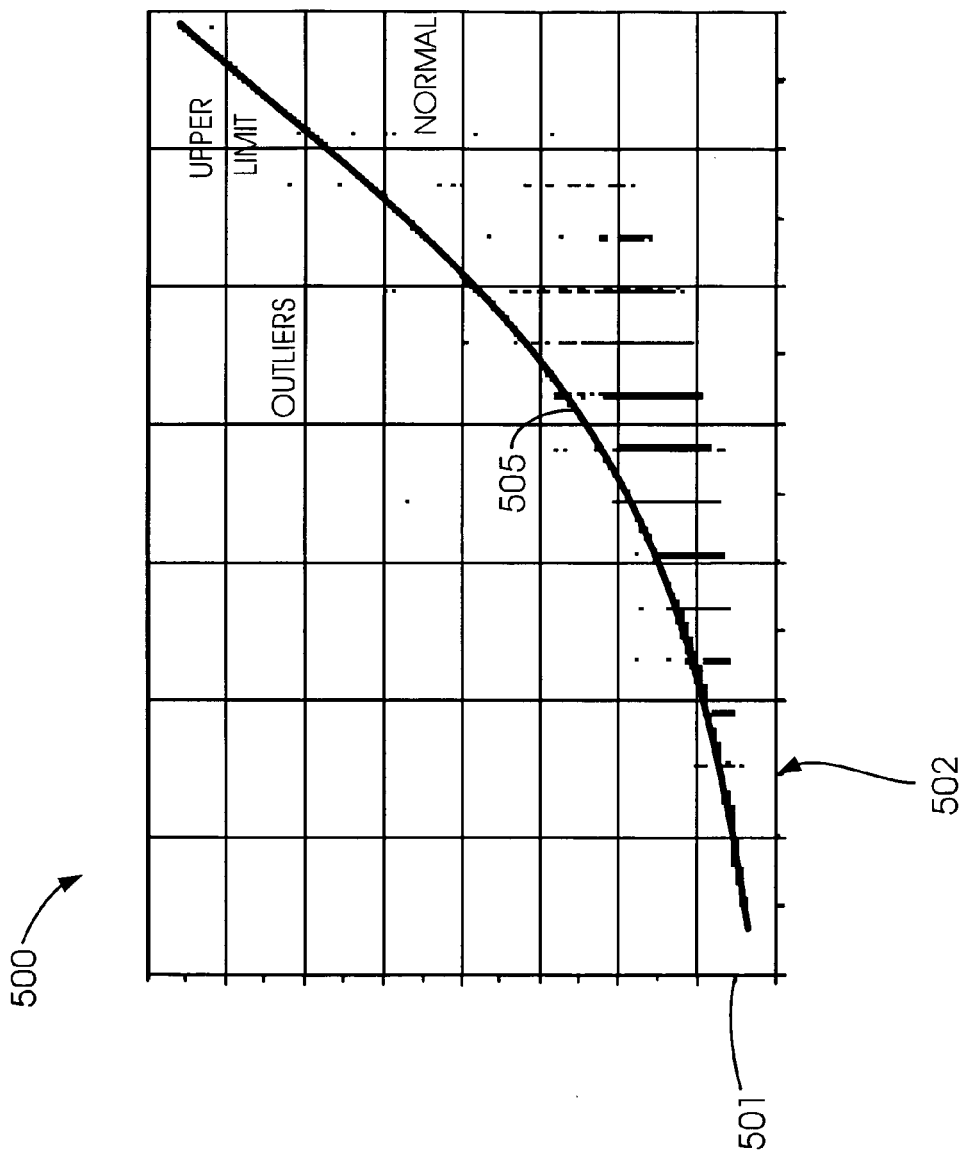
FIG. 5 is a graphical illustration of another relationship between leakage current and test operating frequency showing yet another embodiment of a leakage current threshold function of the present invention.

FIG. 5 is a graphic depiction of another approach. FIG. 5 is a plot 500 of test data collected mapping each tested device as a data point. One axis 501 is used to characterize leakage current produced at $F_{max}$ for the tested device. Another axis 502 defines $F_{max}$ (maximum test operating frequency) for the device. A "best-fit" curve can be used to define a threshold limit for leakage current that spans the entire range of $F_{max}$. As before, devices having leakage currents in excess of the defined limit are characterized a defects and can be processed accordingly. This approach works well when leakage current increases sharply with increasing $F_{max}$. In general, a curve fit is chose that best matches the overall profile of the underlying $F_{max}$ v. threshold current data. Examples, include but are not limited to, linear fit curves, hyperbolic curves, exponential fit curves and the like. The exact type of fit should be adapted to each particular design during the characterization phase. Once an appropriate screening method is chosen, a binning algorithm or formula can easily be programmed into the test program to screen outliers on a tester platform during routine production testing.

Figure 6:
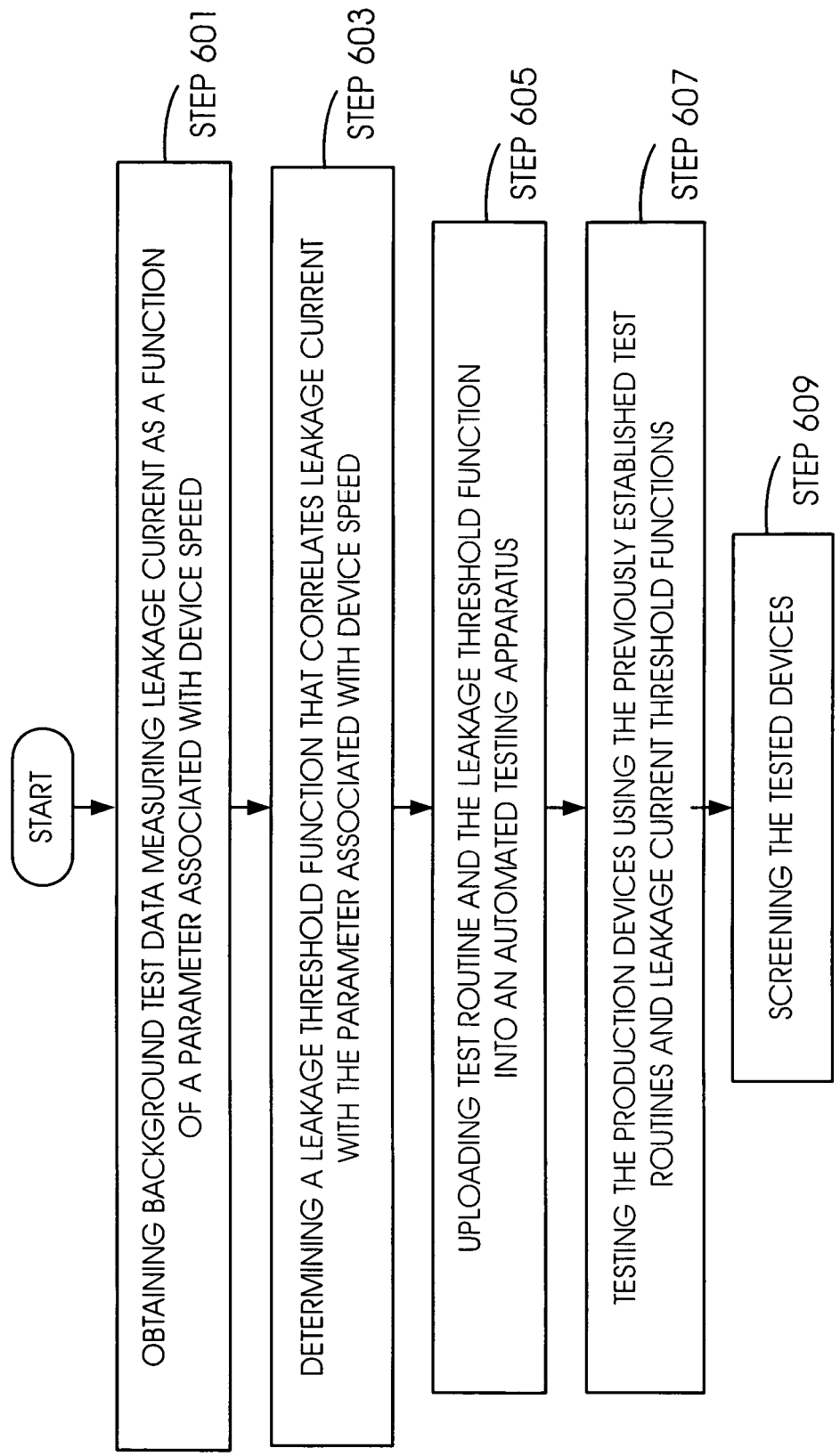
FIG. 6 is a flow diagram illustrating process operations used in executing one method embodiment of the present invention.

FIG. 6 is a simplified flow diagram illustrating one generalized method embodiment for identifying leakage current defects in a device. The inventors contemplate that device is to be broadly interpreted to include, but not limited to, unfinished semiconductor die still un-diced in place on their wafers as well as devices in their various stages of packaging. The flow diagram 600 begins by obtaining background test data with a test routine configured to the measure leakage current of a set of test devices as a function of a parameter associated with device speed for the device under test (Step 601). In one embodiment, the test routine is a function block or a Transition delay fault test block. Of course, other test routines can be employed. The idea being to test as much of the device as possible and to be sensitive to device speed. In one embodiment the parameter associated with device speed for the device under test is the operating frequency of the test routine. In one particular embodiment, the parameter is the maximum operating frequency of the test routine ($F_{max}$).

In some embodiments obtaining the test data includes, generating a test set of die or device lots having a range of device speeds. And then testing them to obtain a pattern of data relating leakage current to device speed. The leakage current can be taken in a number of different ways. Simple, the quiescent current between the power plane and the ground plane. However, the inventors contemplate a number of alternatives, including, but not limited to using an I/O power plane, separate on-chip dedicated device power planes, a core power plane, PLL power, and many other power planes can be tested to determine associated leakage currents. Moreover, the leakage currents can be averages or summed or processed in a number of ways to generate a single leakage current value. Alternatively, several leakage current values can be measured and used to qualify the devices during testing. This all at the discretion of the user.

In some embodiments, it will be confirmed that the test set provides a representative baseline curve of leakage current as a function of the parameter related to device speed. Typically, all that is meant is that leakage current should rise as the parameter rises (in accord with device speed) and that the parameter rises as device speed rises. Once a valid test is determined it can be analyzed.

Using the test data, a leakage threshold function is determined that is correlated with the parameter associated with device speed (Step 603). The leakage threshold function defines a value above which the device under test is determined to have a defect. Generally, this is calculated off-line using the data obtained using the test subjects. This can be obtained by statistically evaluating the performance of the test set to define a desired performance threshold for acceptable leakage current over a set of die speed ranges. In a particular embodiment, the threshold is obtained by statistically evaluating the performance of the test set to define the threshold for acceptable leakage current as function of maximum test operating frequency ($F_{max}$). As previously indicated, this threshold can comprise curve fitting, binning, as well as the entire range of data processing techniques available to one of ordinary skill seeking to identify outlying measurements in a group of data.

The test routine and the leakage threshold function are up loaded into an automated testing apparatus configured to execute testing on production (non-test) devices (Step 605). Typically, this involves inputting a set of test parameters including the leakage threshold function into an automated test apparatus. This particularly easy in cases where the same test apparatus is use to generate the leakage threshold function as is used to test the production devices. However, inputting the data and parameters is a fairly simple process, as is known to those having ordinary skill in the art. Additionally, the leakage threshold function can be adjusted to accommodate the needs of the user.

The production devices are then tested using the previously established test routines and leakage current threshold functions (Step 607). Typical embodiments test each device to determine its leakage current over a range of parameter values associated with device speed. In one embodiment leakage current is tested as a function of test operating frequency or alternatively maximum test operating frequency ($F_{max}$).

Once tested the devices are screened using the leakage threshold function to identify defective devices (Step 609). Typically, the devices that are outliers having too high a leakage current are identified and binned appropriately. In many cases these devices are identified as devices having leakage defects and are discarded. However, the information can be used to track process defects. Additionally, several leakage current thresholds can be defined. Some of the thresholds can define a gray area and devices falling into this so-called "gray area" can be culled from the rest and classified in some intermediate category. Thus, the device can be an outlier, but not a very extreme outlier. Also, a device can be tested as to several different leakage currents and fail some tests but not others. Thus, there is an intermediate category of wafers as defined by a user.

Figure 7A:
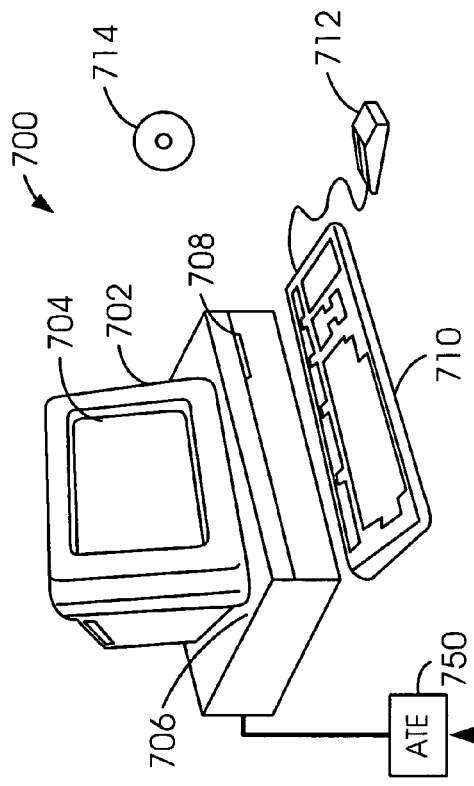
FIGS. 7A and 7B illustrate an example of a computer system that may be used in accordance with the invention.
Figure 7B:
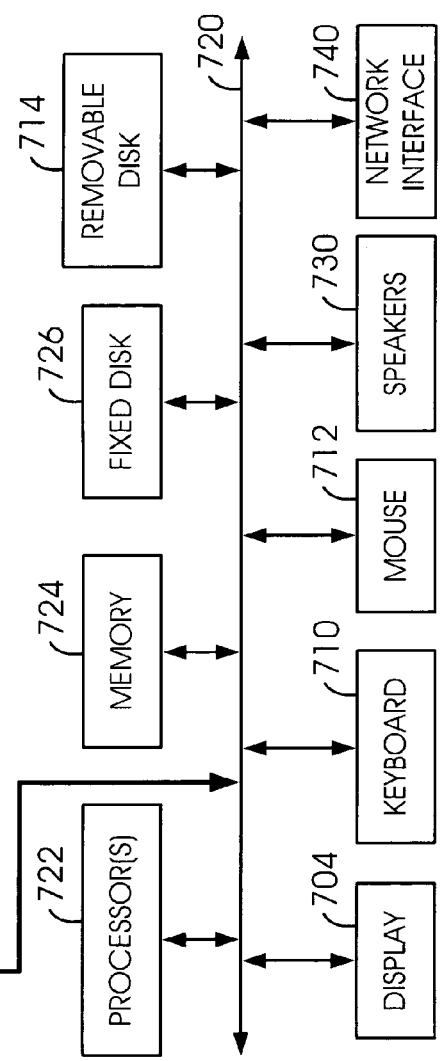

FIGS. 7A and 7B illustrate one non-exclusive example of a computer system 700 that may be used in accordance with the invention. FIG. 7A shows a computer system 700 that includes a display 702, screen 704, cabinet 706, keyboard 710, and mouse 712. Mouse 712 may have one or more buttons for interacting with a graphical user interface. The computer system can form part of or is interconnected to a piece of automated test equipment 750. A typical piece of automated test equipment in accordance with the principles of the invention comprises mounting hardware for the device under test (DUT) (e.g. socket, load board, interface board); test head with driving electronics on movable arm, and electronics cabinet where data handling takes place. Suitable ATE environment include but are not limited to a Tester Platform, Tester Head, LoadBoards, Probecards, and a Working Computer Terminal. Examples equipment can be obtained from a variety of manufactures including but not limited to Advantest, Credence testers, Agilent, Schlumberger and other manufacturers of such testers as are known to those having ordinary skill in the art. However, the inventors point out that the invention is not limited to such ATE.

Continuing, cabinet 706 can house a CD-ROM drive 708, system memory and a hard drive (see FIG. 7B) which may be utilized to store and retrieve software programs incorporating computer code that implements the invention, data for use with the invention, and the like. Although CD-ROM 708 is shown as an exemplary computer readable storage medium, other computer readable storage media including floppy disk, DVD, tape, memory sticks, flash memory, system memory, and hard drive may be utilized. Additionally, a data signal embodied in a carrier wave (e.g., in a network including the Internet) may be the computer readable storage medium. In one implementation, an operating system for the computer system 700 is provided in the system memory, the hard drive, the CD-ROM 708 or other computer readable storage medium and serves to incorporate the computer code that implements the invention. It is to be remembered that the operating system can be configured so it controls all of the processors and/or automated test apparatus of the system. It should be noted that other devices (e.g., printers, scanners, etc.) may be present in the computer system 700.

FIG. 7B shows a system block diagram of computer system 700 used to execute the software of an embodiment of the invention. The computer system 700 includes monitor 704, keyboard 710, and mouse 712. Computer system 700 further includes subsystems, such as a plurality of central processors (CPU's) 722 (including cache memory resources), system memory 724, fixed storage 726 (e.g., hard drive), removable storage 714 (e.g., CD-ROM drive), display adapter, sound card and speakers 730, and network interface 740. Additionally, the system can be networked to automated test equipment 750. Additionally, it should be noted that the computer system 700 can form a part of the ATE 750. The network interface can be used to facilitate connection with many different network structures including the Internet. The central processors 731, for example, can execute computer program code (e.g., an operating system) to implement the invention. An operating system is normally (but not necessarily) resident in the system memory 724 during its execution. Other computer systems suitable for use with the invention may include additional or fewer subsystems. Importantly, the principles of the invention can specifically be implemented on networked computer systems having many individual computers. Such networked systems can include local area networks (LAN's) or a wide area network (WAN's). Particularly, the inventors contemplate computer systems and message traffic operating over the Internet. Additionally, an example of a LAN is a private network used by a mid-sized company with a building complex. Publicly accessible WAN's include the Internet, cellular telephone network, satellite systems and plain-old-telephone systems (POTS). Examples of private WAN's include those used by multi-national corporations for their internal information system needs. The network may also be a combination of private and/or public LANs and/or WANs.

The system bus architecture of computer system 700 is represented by arrows 720. However, these arrows are illustrative of any interconnection scheme serving to link the subsystems. For example, a local bus could be utilized to connect the central processor to the system memory and display adapter. Computer system 700 shown in FIG. 7B is but an example of a computer system suitable for use with the invention. Other computer architectures having different configurations of subsystems may also be utilized.

The invention can use a combination of hardware and software components. The software can be embodied as computer readable code (or computer program code) on a computer readable medium. The computer readable medium is any data storage device that can store data which can thereafter be read by a computer system. Examples of the computer readable medium include read-only memory, random-access memory, CD-ROMs, magnetic tape, and optical data storage devices. The computer readable medium can also be distributed over a network coupled computer systems so that the computer readable code is stored and executed in a distributed fashion.

The many features and advantages of the present invention are apparent from the written description, and thus, it is intended by the appended claims to cover all such features and advantages of the invention. Further, since numerous modifications and changes will readily occur to those skilled in the art, it is not desired to limit the invention to the exact construction and operation as illustrated and described. Hence, all suitable modifications and equivalents may be resorted to as falling within the scope of the invention.

The present invention has been particularly shown and described with respect to certain embodiments and specific features thereof. However, it should be noted that the above-described embodiments are intended to describe the principles of the invention, not limit its scope. Therefore, as is readily apparent to those of ordinary skill in the art, various changes and modifications in form and detail may be made without departing from the spirit and scope of the invention as set forth in the appended claims. Further, reference in the claims to an element in the singular is not intended to mean "one and only one" unless explicitly stated, but rather, "one or more".

What is claimed is:

1. A method for identifying test devices having excessive leakage current, the method comprising:
 a) obtaining background test data by using a test routine to measure leakage current as a function of test operating frequency for a set of test devices such that the testing is performed on a test set of device lots having a known range of device speeds, the testing being performed at a range of test operating frequencies to define a relationship between leakage current and the test operating frequency;
 b) determining, from the test data, a leakage threshold function that correlates with test operating frequency wherein leakage defines a measured leakage cunent and the leakage threshold function defines a leakage current value above which the device under test is determined to have failed the test wherein said process of determining the leakage threshold function comprises statistically evaluating the results of the testing performing on the test set of device lots to define a leakage threshold function that defines an acceptable leakage current over a range of test operating frequencies;
 c) inputting the test routine and the leakage threshold function into an automated testing apparatus configured to execute testing on devices;
 d) testing a device to determine its leakage current over a range of parameter values associated with device speed; and
 e) screening the device using the leakage threshold function to determine the status of the device.

2. The method of claim 1 wherein the leakage threshold function comprises a curve that characterizes acceptable leakage current as a function of test operating frequency.

3. The method of claim 1 wherein the leakage threshold function comprises a plurality of test operating frequency regimes and a curve for each regime that characterizes acceptable leakage current as a function of test operating frequency for each regime.

4. The method of claim 1 wherein the leakage threshold function comprises a step function comprising a plurality of test operating frequency regimes and a leakage current cut-off value for each regime.

5. The method of claim 1 wherein the leakage threshold function is adjustable enabling the threshold to filter out a greater or fewer number of devices at the election of a user.

6. The method of claim 1 wherein the leakage threshold function comprises a means for screening out devices having to high a leakage current for a given test operating frequency.

7. A method for identifying test devices having excessive leakage current, the method comprising:
 a) obtaining background test data by measuring a leakage current for a set of test devices as a function of test operating frequency for the device under test;
 b) determining, from the test data, a leakage threshold function that correlates with the test operating frequency wherein leakage defines a measured leakage current and the leakage threshold function defines a leakage current value above which the device under test is determined to have failed the test;
 c) inputting the test routine and the leakage threshold function into an automated testing apparatus configured wherein the operations of: a) obtaining background test data ; b) determining a leakage threshold function that correlates with the test operating frequency; and c) inputting the test routine and the leakage threshold function into the automated testing apparatus can all be conducted off-line prior to any testing of production devices;
 d) testing a device to determine its leakage current over a range of test operating frequencies wherein said testing is not performed on a dedicated test structure;
 e) screening the device using the leakage threshold function to determine the status of the device; and
 wherein d) testing devices to determine leakage current over a range of test operating frequencies is performed on production devices after steps a)-c) have been previously performed such that e) screening the production devices can be used to determine the status of the production devices substantially contemporaneous with said d) testing.

8. A computer program product embodied on a computer readable media including computer program code for identifying defective devices having excessive leakage current, the computer program product including:
 a) computer program code instructions for executing a test routine capable of measuring leakage current of a device under test as a function of test operating frequency for a set of test devices such that the testing is performed on a test set of device lots having a known range of device speeds, the testing being performed at a range of test operating frequencies to define a relationship between leakage current and the test operating frequency;
 b) computer program code instructions for determining, from the test data, a leakage threshold function that correlates with test operating frequency wherein leakage defines a measured leakage current and the leakage threshold function defines a leakage current value above which the device under test is determined to have failed the test wherein said code instructions for determining the leakage threshold function include statistically evaluating the results of the testing performing on the test set of device lots to define a leakage threshold function that defines an acceptable leakage current over a range of test operating frequencies;
 c) computer program code instructions for inputting the test routine and the leakage threshold function into an automated testing apparatus configured to execute testing on devices;
 d) computer program code instructions for testing a device to determine its leakage current over a range of parameter values associated with device speed; and
 e) computer program code instructions for screening the device using the leakage threshold function to determine the status of the device.

9. The computer program product of claim 8 wherein the determined leakage threshold function comprises a curve that characterizes acceptable leakage current as a function of test operating frequency.

10. The computer program product of claim 8 wherein the leakage threshold function comprises a plurality of test operating frequency regimes and a curve for each regime that characterizes acceptable leakage current as a function of test operating frequency for each regime.

11. The computer program product of claim 8 wherein the leakage threshold function comprises a step function comprising a plurality of test operating frequency regimes and a leakage current cut-off value for each regime.

12. The computer program product of claim 8 wherein the leakage threshold function is adjustable enabling the threshold to filter out a greater or fewer number of devices at the election of a user.

13. The computer program product of claim 8 wherein the leakage threshold function comprises a means for screening out devices having to high a leakage current for a given test operating frequency.

\* \* \* \* \*